US006347049B1

United States Patent
Childress et al.

(10) Patent No.: US 6,347,049 B1
(45) Date of Patent: Feb. 12, 2002

(54) LOW RESISTANCE MAGNETIC TUNNEL JUNCTION DEVICE WITH BILAYER OR MULTILAYER TUNNEL BARRIER

(75) Inventors: Jeffrey R. Childress, San Jose; Bruce A. Gurney, San Rafael; Markus Schwickert, San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/916,077

(22) Filed: Jul. 25, 2001

(51) Int. Cl.[7] .............................. G11C 11/15; G11B 5/39
(52) U.S. Cl. ........................ 365/173; 365/171; 365/158; 360/324.2
(58) Field of Search ................................. 365/173, 171, 365/158; 360/324.2

(56) References Cited

U.S. PATENT DOCUMENTS

| 5,465,185 A | 11/1995 | Heim et al. ............ 360/324.11 |
| 5,640,343 A | 6/1997 | Gallagher et al. .......... 365/171 |
| 5,729,410 A | 3/1998 | Fontana, Jr. et al. ..... 360/324.2 |
| 5,729,411 A | 3/1998 | Kishi et al. ............ 360/327.32 |

FOREIGN PATENT DOCUMENTS

| WO | WO0004591 | 1/2000 | ........... H01L/43/10 |

OTHER PUBLICATIONS

P. K. Wong et al., "High Conductance Magnetoresistive Tunnel Junctions with Multiply Oxidized Barrier," Journal of Applied Physics, vol. 83, No. 11, Jun. 1, 1998, pp. 6697–6699.

M. Sharma et al., "Spin–Dependent Tunneling Junctions with AlN and AlON Barriers," Applied Physics Letters, vol. 77, No. 14, Oct. 2, 2000, pp. 2219–2221.

M. M. Schwickert et al., "Magnetic Tunnel Junctions with AlN and AlNxOy Barriers," Journal of Applied Physics, vol. 89, No. 11, Jun. 1, 2001, pp. 1–3.

R. Jansen et al., "Influence of Barrier Impurities on the Magnetoresistance in Ferromagnetic Tunnel Junctions," (Spin—Dependent Tunneling II (W.J. Gallagher, Chairman), Journal of Applied Physics, vol. 83, No. 11, Jun. 1, 1998, pp. 6682–6684.

Hui–ying Xu et al., "Tunnel Current, Conductance and Magnetoresistance in Double–Barrier Magnetic Tunnel Junctions," Thin Solid Films 375 (2000) pp. 210–214.

*Primary Examiner*—Andrew Q. Tran
(74) *Attorney, Agent, or Firm*—Thomas R. Berthold

(57) ABSTRACT

A low resistance magnetic tunnel junction (MTJ) device has a bilayer or multilayer as the insulating tunnel barrier. In one embodiment the tunnel barrier is a bilayer of a first layer of magnesium oxide on the bottom magnetic electrode and an aluminum oxide layer on the magnesium oxide layer. This bilayer is formed by oxidizing a bilayer of Mg/Al. In a second embodiment the tunnel barrier is a bilayer of first layer of aluminum nitride and a second layer of aluminum oxide on top of the aluminum nitride first layer, with this bilayer formed by oxidizing a bilayer of AlN/Al. MTJ devices with trilayer barriers, such as $AlN/Al_2O_3/AlN$, $MgO/Al_2O_3/MgO$ and $Al_2O_3/MgO/Al_2O_3$ are also possible. The resulting magnetic tunnel junction devices have resistance-area values less than 1000 $\Omega(\mu m)^2$ and preferably in the range of 0.1 to 100 $\Omega(\mu m)^2$, making the devices suitable for magnetic read sensors.

13 Claims, 5 Drawing Sheets

LOW RESISTANCE MAGNETIC TUNNEL JUNCTION DEVICE WITH BILAYER OR MULTILAYER TUNNEL BARRIER

TECHNICAL FIELD

This invention relates to magnetic tunnel junction (MTJ) devices for memory, recording head and external magnetic field-sensing applications. More particularly the invention relates to a MTJ device that uses an improved insulating tunnel barrier that improves the properties of the MTJ.

BACKGROUND OF THE INVENTION

A magnetic tunnel junction (MTJ) is comprised of two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as a memory cell in a nonvolatile magnetic random access memory (MRAM) array, as described in IBM's U.S. Pat. No. 5,640,343, and as a magnetic field sensor, such as a magnetoresistive read head in a magnetic recording disk drive, as described in IBM's U.S. Pat. No. 5,729,410.

FIG. 1 illustrates a cross-section of a conventional MTJ device. The MTJ 10 includes a bottom "fixed" ferromagnetic (FM) layer 18 as the bottom magnetic electrode, an insulating tunnel barrier layer 20, and a top "free" FM layer 32 as the top magnetic electrode. The MTJ 10 has bottom and top electrical leads, 12, 14, respectively, with the bottom lead 12 being formed on a suitable substrate. The FM layer 18 is called the "fixed" layer because it is formed of a high-coercivity material whose magnetic moment (magnetization direction) is prevented from rotation in the presence of applied magnetic fields in the desired range of interest for the MTJ device, i.e., the magnetic field caused by the write current applied to the memory cell from the read/write circuitry of the MRAM or the magnetic field from the recorded magnetic layer in a magnetic recording disk. The magnetic moment of FM layer 18 can also be fixed by being exchange coupled to an antiferromagnetic layer. The fixed FM layer may also be the laminated or antiparallel (AP) pinned type of structure, as described in IBM's U.S. Pat. No. 5,465,185. The magnetic moment of the free FM layer 32 is not fixed, and is thus free to rotate in the presence of an applied magnetic field in the range of interest. In the absence of an applied magnetic field the moments of the FM layers 18 and 32 are aligned generally parallel (or antiparallel) in a MTJ memory cell and generally perpendicular in a MTJ magnetoresistive read head. The relative orientation of the magnetic moments of the FM layers 18, 32 affects the tunneling current and thus the electrical resistance of the MTJ device.

An important metric for MTJ device applications is the signal-to-noise ratio (SNR). The magnitude of the signal is dependent upon the magnetoresistance or MR ($\Delta R/R$) exhibited by the device. The magnetoresistance (MR) of a MTJ device is also referred to as the tunneling magnetoresistance (TMR). The signal is given by $i_B \Delta R$, which is the bias current ($i_B$) passing through the MTJ device (assuming a constant current is used to detect the signal) times the resistance change ($\Delta R$) of the device. However, the noise exhibited by the MTJ device is determined, in large part, by the resistance R of the device. Thus to obtain the maximum SNR for constant power used to sense the device the resistance (R) of the device must be small and the change in resistance ($\Delta R$) of the device large.

The resistance of a MTJ device is largely determined by the resistance of the insulating tunnel barrier layer for a device of given dimensions since the resistance of the electrical leads and the ferromagnetic layers contribute little to the resistance. Moreover, because the sense current passes perpendicularly through the ferromagnetic layers and the tunnel barrier layer, the resistance R of a MTJ device increases inversely with the area A of the device. The requirement for low resistance MTJ devices, coupled with the inverse relationship of resistance with area, is especially troublesome because an additional requirement for MTJ device applications is small area. For an MRAM the density of MTJ memory cells in the array depends on small area MTJs, and for a read head high storage density requires small data trackwidth on the disk, which requires a small area MTJ read head. Since the resistance R of a MTJ device scales inversely with the area A, it is convenient to characterize the resistance of the MTJ device by the product of the resistance R times the area A (RA). Thus RA is independent of the area A of the MTJ device.

In the prior art, the material used for the tunnel barrier layer is aluminum oxide ($Al_2O_3$) because such barrier layers can be made very thin and essentially free of pin holes or other defects. For $Al_2O_3$ barrier layers it has been found that RA increases exponentially with the thickness of the layer. The thickness of $Al_2O_3$ barrier layers can be varied over a sufficient range to vary RA by more than eight orders of magnitude, i.e., from more than $2 \times 10^9$ $\Omega(\mu m)^2$ to as little as 5 $\Omega(\mu m)^2$. However, for these lower RA values, the MR is typically reduced, in part because of microscopic pin holes or other defects in the ultra thin tunnel barrier layers needed to obtain these very low RA values. For MRAM applications RA values in the range 500–1000 $\Omega(\mu m)^2$ are acceptable, although it would be useful to be able to prepare MTJ memory cells with even lower RA values so that, for example, current could be passed perpendicularly through the MTJ cell to aid in the writing of the cell. Moreover, for scaling to ever higher memory capacities, MRAM cells will need to be shrunk in size, requiring lower RA values so that the resistance of the cell is not too high. More importantly, for MTJ read heads to be competitive in SNR with conventional giant magnetoresistance (GMR) spin-valve read heads, the MTJ heads need to have resistance values comparable to those of GMR heads. Since read heads of submicron size are required for high density recording applications, MTJ heads with RA values lower than 5 $\Omega(\mu m)^2$ are desirable, which is an RA value less than what can be obtained with $Al_2O_3$ tunnel barriers.

Thus it is desirable to develop MTJ devices with lower RA values than can be achieved with MTJ devices that use conventional single-layer $Al_2O_3$ tunnel barriers, and where the lower RA values can be achieved without sacrificing high MR.

In IBM's pending application, Ser. No. 09/552,062 filed Apr. 19, 2000, oxides and nitrides of indium and gallium are suggested as tunnel barrier materials, wherein for a given barrier thickness a lower tunnel resistance results. This application also suggests that a thin layer of aluminum oxide or nitride can be used with the indium or gallium oxide or nitride to form a bilayer tunnel barrier.

R. Jansen et al. (*J Appl. Phys.*, 83, 11 (June 1998)) describe the effect of adding impurities such as Co, Pd, Cu or Ni into the middle of the insulating aluminum oxide barrier to affect the TMR. A single layer of aluminum oxynitride has been proposed as a tunnel barrier layer for reducing the resistance of the MTJ device in PCT application WO 00/04591, published Jan. 27, 2000, and by M. Sharma et al. (*Appl. Phys. Lett.* 77, 14 (Oct. 2, 2000)).

The literature also describes bilayers or multiple barriers being used in tunneling structures, but all of these are high resistance devices. For example, A. Vedyayev et al. (*Phys. Rev. B.* 61, 1366 (2000)) discuss theoretically the magnetoresistance of tunnel-valves with P/O and P/O/P barriers, where P is a paramagnetic metal and O is an insulating oxide, in order to describe the experimental results of J. J. Sun et al for the case of $Cu/Al_2O_3$ and $Cu/Al_2O_3/Cu$ (*J. Appl. Phys.* 85, 5264 (1999)). This work focuses on the decay of magnetoresistance across the P layers and on the formation of quantum-well states in the P layers. In contrast to the present invention, these studies use a single insulating barrier, result in high specific junction resistances (about $1 \times 10^8 \, \Omega(\mu m)^2$), and the P layer decreases the TMR without reducing the resistance. Other studies such as those by De Teresa et al. (*JMMM* 211, 160 (2000)) have focussed on the dependence of the TMR effect on the magnetic layer/barrier interface, such as $Co/Al_2O_3$ vs. $Co/SrTiO_3$. They have used bilayer barriers in those studies, such as $SrTiO_3/Al_2O_3$, to illustrate the effect of different interfaces on the two magnetic electrodes. P. K. Wong et al. (*J. Appl. Phys.* 83, 11 (Jun. 1, 1998)) prepared, as shown in Table 1, an MTJ device with a tunnel barrier of a bottom $Al_2O_3$/top MgO bilayer formed by sputter depositing Al/Mg in an oxygen atmosphere, but that device resulted in a high RA product of $1.2 \times 10^8 \, \Omega(\mu m)^2$. Again, in contrast to the present invention, these studies concern tunnel barriers with much higher resistance (about $2 \times 10^4 \, \Omega(\mu m)^2$ and higher) and do not address the applicability of bilayer barriers to low-resistance (low RA) magnetic tunnel junction devices.

In addition, other parameters besides the overall MTJ device resistance need to be optimized. These include the magnetic properties of each magnetic electrode, the magnetic coupling between the magnetic electrodes, the electron spin polarization at the interfaces between the magnetic electrodes and the tunnel barrier and the degree of atomic interdiffusion between the magnetic electrodes and the barrier. These parameters influence the magnetic performance of the MTJ device, the magnitude of the TMR, and the dependence of the magnetoresistance on the bias voltage applied to the device. Because each of these parameters is primarily dependent on the nature of the interface region between the barrier and the magnetic electrodes, there is a need for an improved tunnel barrier structure which can improve these characteristics in MTJ devices and which offers more flexibility in obtaining desired MTJ properties.

SUMMARY OF THE INVENTION

The invention is a low resistance magnetic tunnel junction device with a bilayer or multilayer insulating tunnel barrier. In one bilayer barrier embodiment the tunnel barrier is a first layer of magnesium oxide on the bottom magnetic electrode and an aluminum oxide layer on the magnesium oxide layer. The bilayer is formed by oxidizing a brayer of Mg/Al. In a second bilayer embodiment the first layer is aluminum nitride and the second layer is aluminum oxide on top of the aluminum nitride first layer, with this bilayer formed by oxidizing a bilayer of AlN/Al. Trilayer barrier embodiments are also possible, such as $AlN/Al_2O_3/AlN$, $MgO/Al_2O_3/$ MgO and $Al_2O_3/MgO/Al_2O_3$. The resulting magnetic tunnel junction devices have resistance-area values less than $1000 \, \Omega(\mu m)^2$ and preferably in the range of 0.1 to 100 $\Omega(\mu m)^2$, making the devices suitable for magnetic read sensors.

For a fuller understanding of the nature and advantages of the invention, reference should be made to the following detailed description taken together with the accompanying figures.

DESCRIPTION OF THE PREFERRED EMBODIMENTS

Since the nature of the interfaces between the barrier and the magnetic electrodes determines the effective barrier energy height, the interfacial chemical profile, the magnetic profile, and the electron spin, it is desirable to develop alternative barriers that offer a greater degree of control over these parameters. The desired result is MTJ sensors with lower RA, higher TMR and lower dependence on bias voltage.

Figure 1:
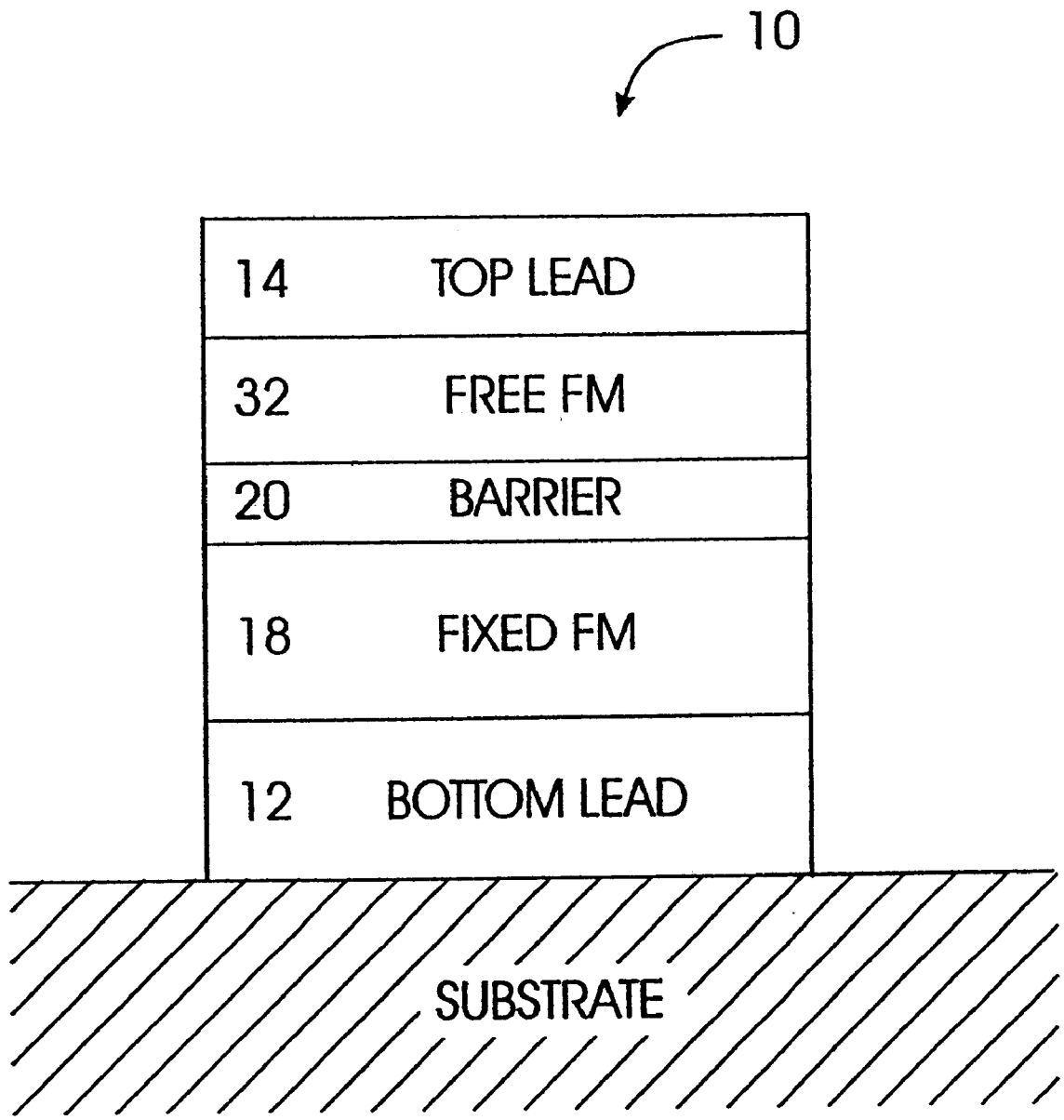
FIG. 1 shows a cross-section view of a conventional MTJ sensor.
Figure 2:
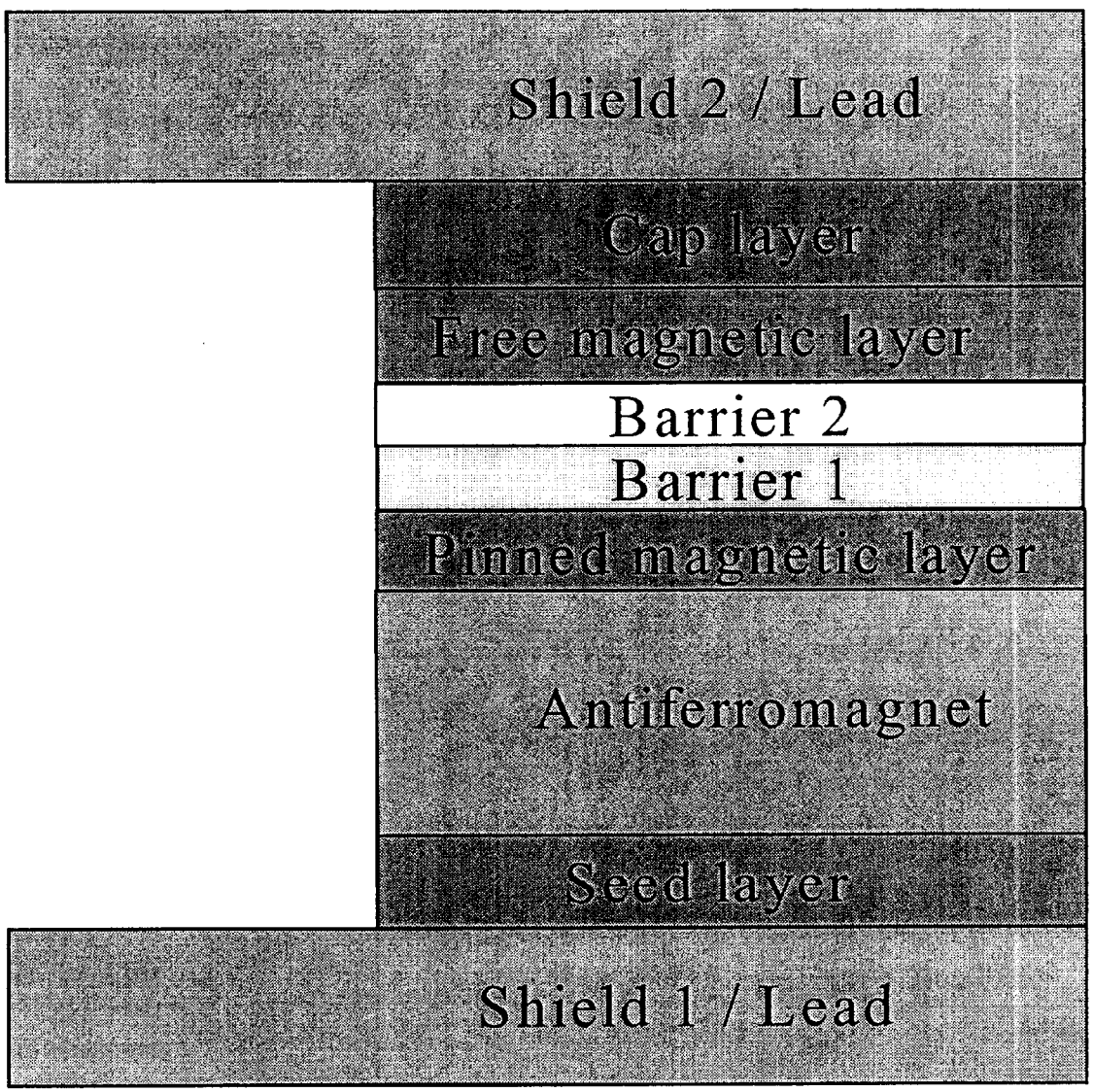
FIG. 2 shows a cross-section of a MTJ sensor with bilayer barrier.
Figure 3:
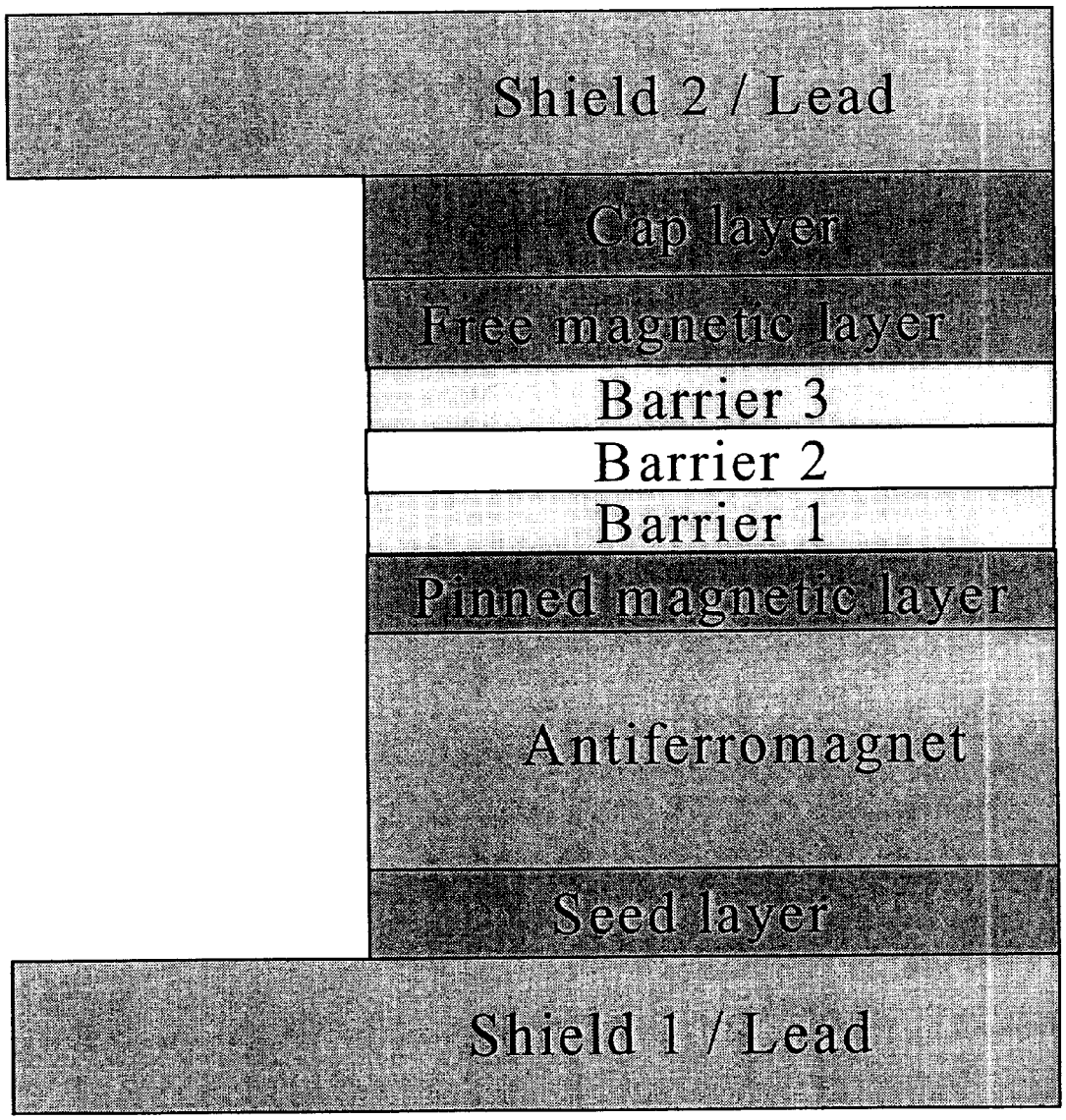
FIG. 3 shows a cross-section of a MTJ sensor with trilayer barrier.

The invention replaces the single tunnel barrier layers by two or more layers that together form a compound tunneling barrier. As shown in FIG. 2, the single insulating barrier layer is replaced by at least two layers. The invention is directed to MTJ devices with low specific junction resistances, i.e., less than $1000 \, \Omega(\mu m)^2$, and in the specific types of devices fabricated, the RA values are in the range of $2-200 \, \Omega(\mu m)^2$.

The advantages of the multiple barriers are:
1) Barrier 2 can be used to cap or plug physical pinholes in barrier 1 when barrier 1 is very thin. These pinholes, if not plugged by an insulator, lead to electrical shorting and low TMR.
2) Barrier 1 and barrier 2 can be of different materials to optimize the interfacial chemistry and chemical interdiffusion with each magnetic electrode layer.
3) Barrier 1 and barrier 2 can be of different materials to optimize the magnetic properties of each magnetic electrode layer.
4) Barrier 1 and barrier 2 can be of different materials to optimize the electron spin polarization at the interface with each magnetic electrode layer.
5) The insulating barrier height of each thin barrier can be advantageously made to be very different. The specific MTJ impedance may then be dominated by the tunneling characteristics through the thin barrier with the largest barrier height, but the physical separation between the free and pinned ferromagnetic layers is still the total thickness of the multiple barriers, thus reducing the magnetic coupling between the free and pinned layers.

The same arguments listed above hold for the case of MTJ devices with three or more barriers, such as shown in FIG.

3. In this trilayer barrier configuration, barrier 3 determines the interfacial properties between the free ferromagnetic layer and the barrier. One trilayer barrier configuration is a first barrier of 2–5 Å AlN, a second barrier of $Al_2O_3$ formed by first depositing 1–5 Å Al and then oxidizing to form $Al_2O_3$, and a third barrier of 2–5 Å AlN. The advantage of this trilayer barrier configuration is that both magnetic electrodes are in contact with AlN rather than $Al_2O_3$. A trilayer barrier using MgO can be formed by first depositing 2–5 Å Mg metal, then depositing 1–5 Å Al metal, oxidizing the Mg and Al to form the first two barriers, depositing 1–5 Å Mg, and finally oxidizing the Mg to form the third barrier of MgO. It is also possible to switch the Al and the Mg in the same process to form another trilayer barrier configuration using MgO, namely $Al_2O_3$/MgO/$Al_2O_3$.

Figure 4:
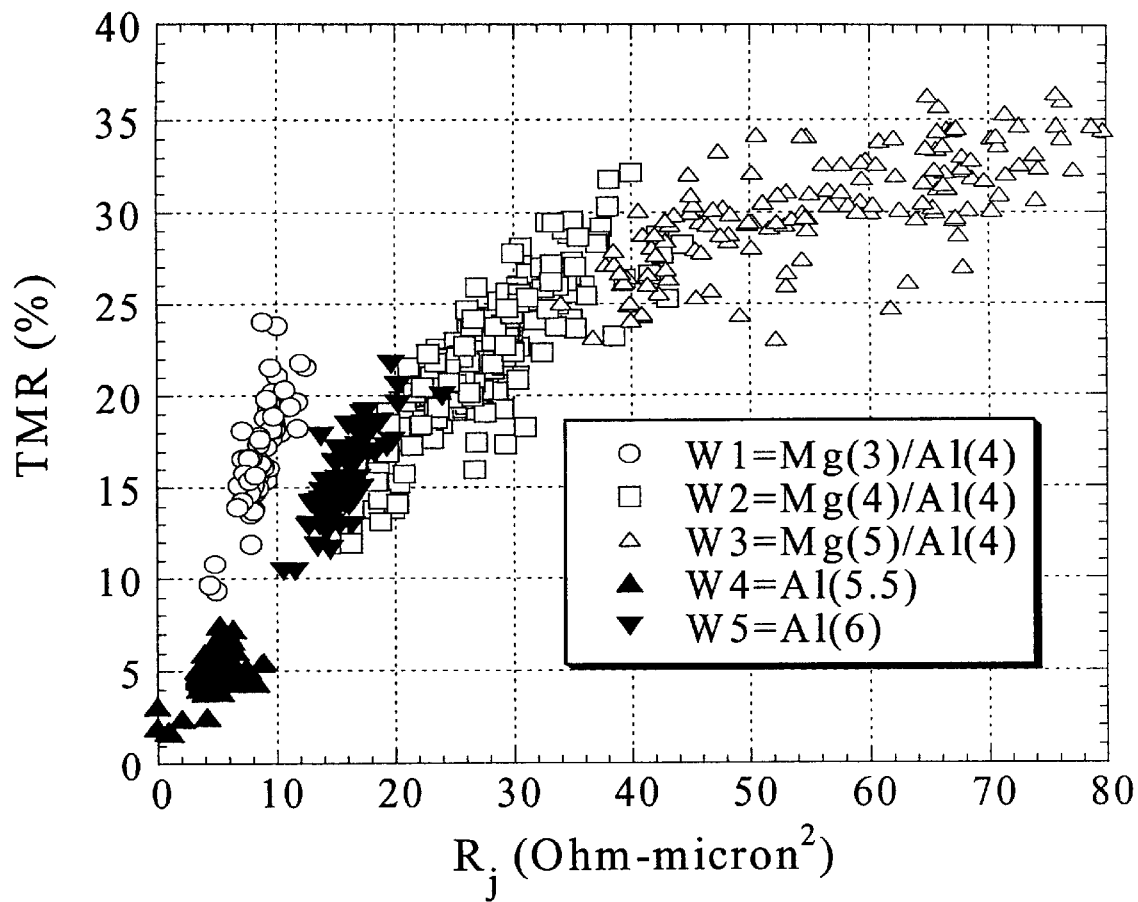
FIG. 4 shows the magnetoresistance of MTJ sensors with single layer aluminum oxide and bilayer magnesium oxide/aluminum oxide barriers.

The advantageous performance of bilayer barriers is demonstrated in FIG. 4, where a preferred embodiment with oxidized Al or Mg/Al barriers are compared. All of the devices have the following structure: Si/2000 Å $Al_2O_3$/50 Å Ta/700 Å Cu/100 Å Ta/250 Å PtMn/20 Å $Co_{85}Fe_{15}$/Barrier/ 10 Å $Co_{85}Fe_{15}$/41 Å $Ni_{84}Fe_{16}$/100 Å Ta. The barrier structures are: W1=Mg(3Å)/Al(4 Å), W2=Mg(4 Å)/Al(4 Å), W3=Mg(5 Å)/Al(4 Å), W4=Al(5.5 Å), and W5=Al(6 Å). After barrier metal deposition the insulating barriers are formed by in-situ oxidation in 500 mTorr $O_2$ for 15 minutes. Particularly relevant is a comparison of W1, with a brayer Mg(3 Å)/Al(4 Å) barrier metal layer, and W5, with a single Al(6 Å) barrier layer. W1 achieves lower specific resistance (8 $\Omega(\mu m)^2$ vs. 16 $\Omega(\mu m)^2$) and higher average MR (18% vs. 16%) compared to W5. In this embodiment the Mg layer is more difficult to oxidize (more resistant to oxidation) than the Al layer, resulting in a lower effective barrier height for the Mg oxide layer compared to the Al oxide layer. Thus the barrier resistance is dominated by the oxidized 4 Å-thick Al layer, resulting in a lower resistance compared to the single-layer barrier formed with a 6 Å-thick Al layer. Furthermore, it can be seen that trying to instead reduce the resistance by decreasing the single Al layer thickness to 5.5 Å (W4) results in an unacceptable decrease of the TMR to about 5%, which underscores the value of the present invention. Thus in this embodiment it is preferred to have the MgO as the bottom layer in the bilayer barrier.

As indicated previously it is possible by modifying the barrier interfaces with the magnetic electrodes to modify the voltage bias dependence of the magnetoresistance. This dependence is usually characterized by the parameter $V_{50}$, which is the voltage needed to reduce the magnetoresistance to 50% of its value at zero bias. For the bilayer barrier W1, we find $V_{50}$=400 mV, while for a single 6 Å-thick Al barrier we find $V_{50}$=300 mV. Thus the modification of the barrier metal from single-layer Al to bilayer Mg/Al has resulted in a barrier with the advantages of lower RA, higher TMR, and larger $V_{50}$.

Figure 5:
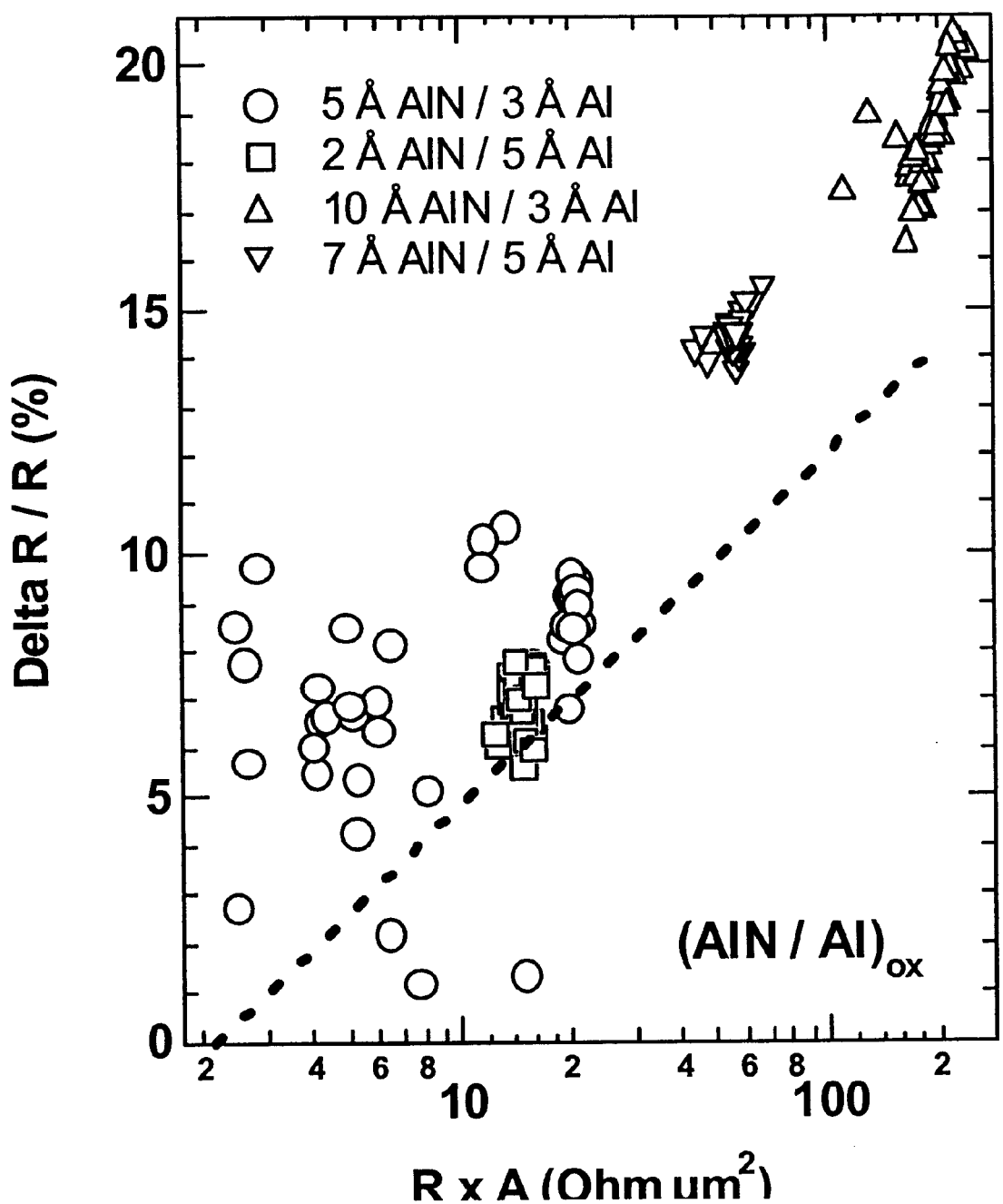
FIG. 5 shows the magnetoresistance versus junction resistance-area of MTJ sensors with bilayer $AlN/Al_2O_3$ barriers compared to single layer AlNOx barriers.

Another embodiment demonstrating improved performance for bilayer tunnel barriers is shown in FIG. 5 for tunnel junction devices with bilayer tunnel barriers of AlN/$Al_2O_3$ formed by oxidation of AlN/Al for 15 minutes at 500 mTorr $O_2$. The TMR versus RA for these barriers is represented by the various data points (for different AlN and Al thicknesses between 2 and 10 Å) in FIG. 5 and compared to data (represented by the dashed line in FIG. 5) for single layer aluminum oxynitride (AlNOx) barriers formed by oxidation of AlN for 15 minutes at 500 mTorr $O_2$. These structures are of the form: AlTiC/50 Å Ta/250 Å Au/100 Å Ta/300 Å PtMn/25 Å $Co_{80}Fe_{20}$/Barrier/10 Å $Co_{80}Fe_{20}$/35 Å $Ni_{84}Fe_{16}$/Ta. The AlN films were formed by reactive deposition of Al in 2 mTorr of Ar(80%)-$N_2$(20%) gas. It can be seen that over the entire RA range studied (2–200 $\Omega(\mu m)^2$), the bilayer barriers result in higher TMR. In this case the Al layer is believed to reduce the density of physical pinholes or other defects in the AlN layer, thus decreasing parasitic shunting and increasing the TMR. Also, single $Al_2O_3$ barriers generally lead to higher TMR than single AlN barriers due to more favorable interface properties with the top magnetic electrode. Because AlN is reasonably stable it is believed that oxidation of the AlN/Al bilayer does not substantially oxidize the bottom AlN layer, so that the bottom layer in the bilayer consists essentially of only AlN. An advantage of using the AlN as the bottom layer is that because it is on top of the bottom magnetic electrode it protects the bottom magnetic electrode from exposure to oxygen that will degrade its magnetic and tunneling properties. Thus in this invention the use of a bilayer tunnel barrier allows simultaneous and independent improvements of the two barrier/electrode interfaces in the tunnel junction. Boron (B), which forms oxide and nitride insulators, can be expected to display similar results when substituted for Al. Thus a bilayer barrier of XN/X-oxide, where X can be Al or B, where each of the layers is very thin, will result in a MTJ device with low RA values.

While the invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device comprising:
   a first ferromagnetic layer and a second ferromagnetic layer, one of the ferromagnetic layers having its magnetic moment fixed in a preferred direction in the presence of an applied magnetic field in the range of interest and the other of the ferromagnetic layers having its magnetic moment free to rotate in the presence of the applied magnetic field in the range of interest; and
   a tunnel barrier layer located between the first and second ferromagnetic layers, the tunnel barrier layer comprising a first barrier layer of insulating material formed on and in contact with the first ferromagnetic layer and a second barrier layer of insulating material different from the material of the first barrier layer and located between the first barrier layer and the second ferromagnetic layer;
   and wherein the magnetic tunnel junction device has a resistance-area value less than approximately 1000 $\Omega(\mu m)^2$.

2. The magnetic tunnel junction device according to claim 1 wherein the device is a magnetoresistive read head.

3. The magnetic tunnel junction device according to claim 1 wherein the device is a magnetic memory cell.

4. The magnetic tunnel junction device according to claim 1 wherein the first ferromagnetic layer has its magnetic moment fixed and further comprising a layer of antiferromagnetic material in contact with the fixed ferromagnetic layer for pinning the magnetic moment of the fixed ferromagnetic layer.

5. The magnetic tunnel junction device according to claim 1 wherein the magnetic moments of the first and second ferromagnetic layers are oriented generally perpendicular to one another in the absence of the applied magnetic field.

6. The magnetic tunnel junction device according to claim 1 wherein the magnetic moments of the first and second ferromagnetic layers are oriented generally parallel or antiparallel to one another in the absence of the applied magnetic field.

7. The magnetic tunnel junction device according to claim 1 wherein the first barrier layer is magnesium oxide and the second barrier layer is aluminum oxide.

8. The magnetic tunnel junction device according to claim 7 further comprising a third barrier layer formed of magnesium oxide and located between and in contact with the second barrier layer of aluminum oxide and the second ferromagnetic layer.

9. The magnetic tunnel junction device according to claim 1 wherein the first barrier layer is aluminum nitride and the second barrier layer is aluminum oxide.

10. The magnetic tunnel junction device according to claim 9 further comprising a third barrier layer formed of aluminum nitride and located between and in contact with the second barrier layer of aluminum oxide and the second ferromagnetic layer.

11. The magnetic tunnel junction device according to claim 9 wherein the first aluminum nitride layer has a thickness in the range of approximately 2 to 7 Angstroms.

12. The magnetic tunnel junction device according to claim 1 wherein the first barrier layer is boron nitride and the second barrier layer is boron oxide.

13. A magnetic tunnel junction read sensor comprising:

a first electrical lead;

a fixed ferromagnetic layer having a magnetic moment that is fixed in a preferred direction in the presence of an applied magnetic field in the range of interest;

an antiferromagnetic layer between the first lead and the fixed ferromagnetic layer for pinning the magnetic moment of the fixed ferromagnetic layer in its fixed direction;

a free ferromagnetic layer whose magnetic moment is free to rotate in the presence of the applied magnetic field in the range of interest;

a bilayer insulating tunnel barrier layer located between the fixed and free ferromagnetic layers, the bilayer consisting of a first layer consisting essentially of aluminum nitride on and in contact with the fixed ferromagnetic layer and a second layer consisting essentially of aluminum oxide located between and in contact with the aluminum nitride layer and the free ferromagnetic layer; and a second electrical lead on the free ferromagnetic layer; and wherein the magnetic tunnel junction read sensor has a resistance-area value in the range of approximately 0.1 to 100 $\Omega(\mu m)^2$.

* * * * *